United States Patent [19]

Kishita et al.

[11] Patent Number: 5,329,154
[45] Date of Patent: Jul. 12, 1994

[54] COMPOUND SEMICONDUCTOR INTEGRATED CIRCUIT HAVING IMPROVED ELECTRODE BONDING ARRANGEMENTS

[75] Inventors: Yoshihiro Kishita; Toshikazu Fukuda; Yuji Minami, all of Tokyo, Japan

[73] Assignee: Kabushiki Kaisha Toshiba, Kawasaki, Japan

[21] Appl. No.: 32,278

[22] Filed: Mar. 17, 1993

[30] Foreign Application Priority Data

Mar. 17, 1992 [JP] Japan ................................. 4-060374
Apr. 15, 1992 [JP] Japan ................................. 4-095031

[51] Int. Cl.$^5$ ................. H01L 29/784; H01L 31/0224
[52] U.S. Cl. ..................................... 257/532; 257/192; 257/195
[58] Field of Search ............... 257/194, 195, 192, 188, 257/23-29, 20-22, 183, 458, 184, 189, 532, 277

[56] References Cited

U.S. PATENT DOCUMENTS

| | | | |
|---|---|---|---|
| 4,739,385 | 4/1988 | Bethea et al. | 257/184 |
| 4,996,163 | 2/1991 | Sasaki | 257/194 |
| 5,170,228 | 12/1992 | Sasaki | 257/195 |

FOREIGN PATENT DOCUMENTS 0184875  7/1989  Japan ................................. 257/194

Primary Examiner—Rolf Hille
Assistant Examiner—Alexander Oscar Williams
Attorney, Agent, or Firm—Oblon, Spivak, McClelland, Maier & Neustadt

[57] ABSTRACT

An integrated circuit including a wafer having a GaAs substrate, an un-doped GaAs layer, and a GaAs active layer. This active layer may have an HEMT structure to improve its operation speed. Also, the substrate may a multi-layer structure to form a three dimensional capacitor. At least one mesa portion is formed on the substrate by removing a portion of the un-doped GaAs layer and GaAs active layer. A source electrode, for example, is formed on the mesa portion, and a ground electrode is formed on an exposed surface of the substrate. These electrodes are connected to each other by means of a wiring metal layer. As a result, the source electrode is easily grounded without using a long bonding wire.

4 Claims, 2 Drawing Sheets

COMPOUND SEMICONDUCTOR INTEGRATED CIRCUIT HAVING IMPROVED ELECTRODE BONDING ARRANGEMENTS

BACKGROUND OF THE INVENTION

1. Field of the Invention

This invention relates to the integration of compound semiconductor devices. In particular, the invention relates to a compound semiconductor integrated circuit, in which HEMT-ICs or super high frequency analog ICs are incorporated, and the fabrication method thereof.

2. Description of the Prior Art

Recently, a compound semiconductor FET made of GaAs is drawing attention due to its higher electron mobility than that of Si. In addition, an FET device, called HEMT (High Electron Mobility Transistor), which has a hetero-junction between an AlGaAs layer and a GaAs layer, has been developed. In this device, electrons around the interface between said layers are used as carriers. On comparing this device with a GaAs FET, it has better high-frequency response, lower noise generation rate, and higher output capacity than those of the GaAs FET.

In FIG. 5, the sectional structure of an HEMT is shown according to a prior art of this invention. As shown in this figure, this device is comprised of the following: a semi-insulative GaAs substrate 51; a buffer layer 52 which is formed about a few $\mu$m thick on said substrate 51 and has a high resistivity; a un-doped GaAs layer 53, having about 0.2 to 0.3 $\mu$m, in which very little impurity is contained; an n type $Al_x Ga_{1-x} As$ ($x=0.3$) layer 54 formed on said layer 53; an n+ type GaAs layer 55 formed on said layer 54; a source electrode 56 formed on said layer 55; a drain electrode 57 formed on said layer 55; and a gate electrode 58 formed on said layer 54. In this device, said layer 55 is formed in order to make good contact between layer 54 and electrode 56 or 57. Gate electrode 58 is formed as follows. At first, electrodes 56 and 57 are formed on n+ type GaAs layer 55. Then, a part of layer 55 is recess-etched to expose a surface part of layer 54. An electrode material is then adhered to this exposed area so as to form gate electrode 58.

In said prior art HEMT, said electrodes are bonded by wire to form a super high-frequency device. In this case, especially, the bonding wire for connecting a source electrode with a source pad must be made as short as possible. Otherwise, the source inductance will increase, and the high-frequency characteristics will be deteriorated.

Integration techniques of said devices have also been investigated. In one technique, a hole is formed on substrate 51 in such a way that source electrode 56 is grounded by connecting it with the back surface electrode through said hole. This technique is called "beer hall technique" and can reduce the source inductance. However, substrate 51 is easy to break because it has already been scraped into less than 100 $\mu$m thickness. In order to realize said technique, substrate 51 must undergo anisotropic dry etching to remove said 100 $\mu$m thickness. Plate 51 is so thin that the execution of this etching is difficult. Thus, the beer hall technique is very difficult to realize.

On the contrary, if source electrode 51 is connected with a source pad by a wire in a usual way, the source inductance increases, thus resulting in the deterioration of the high-frequency characteristics.

As described above, in the prior art compound semiconductor integrated circuit (IC), the reduction of source inductance is essential in order to incorporate an HEMT into an IC. However, the beer hall technique, in which a deep hole is formed through the substrate from the back surface, is very difficult to realize in an actual fabrication process.

On the other hand, in the case of a prior art GaAs analog IC (MMIC), a self by-pass method is often adopted, the method in which a large capacity, ex., 100 pF, of bypass condenser is used. To realize this method, a large capacity chip condenser is connected to the IC from outside. On the other hand, in order to integrate said bypass condenser, an MIM capacitor has been developed.

The MIM capacitor is constructed as follows. On a first metal layer made of Ti, Pt, or Au, a CVD film of about 2000 Å thickness is formed. This film is made of p-type SiN and has dielectric constant 7. Then, a second metal layer is deposited on the CVD film.

FIG. 6 shows the circuit structure of a GaAs analog IC, in which said MIM capacitor is incorporated. In this figure, the gate electrode of a GaAs FET 61 is connected to an input 62, and its drain electrode is connected to an output 63. In addition, the source electrode of GaAs FET 61 is connected to the ground through a resistor 64. A bypass pass condenser 65 is inserted between the source electrode of GaAs FET 61 and the ground. The same resistor 64 is also inserted between the gate electrode of GaAs FET 61 and the ground.

In actuality, said condenser 65 is not required to have a capacity value precisely. However, it must have a large capacity. In order to realize such a large value, a device having a relatively large chip size is required.

To reduce the chip size, the p-SiN film may be formed as a thin film to increase the dielectric constant, and therefore, the capacitance. In this case, however, the first and second metal layers easily causes shorts, thus lowering the yield of devices.

SUMMARY OF THE INVENTION

This invention has been made to overcome the above mentioned problems of the prior art compound semiconductor IC.

Therefore, an objective of this invention is to provide a compound semiconductor IC and its fabrication method, the IC which is capable of reducing the source inductance so as to realize excellent high-frequency characteristics.

Another objective of this invention is to provide a compound semiconductor IC and its fabrication method, which are capable of reducing the number of pads and wirings on the IC so as to reduce the chip size.

Another objective of this invention is to provide a compound semiconductor IC and its fabrication method, which are capable of incorporating a capacitor having a large capacity onto the IC without increasing the chip size or lowering the production yield.

The first feature of the present invention provides a compound semiconductor integrated circuit which is comprised of the following: a compound semiconductor substrate; a buffer layer formed on the substrate and having a high resistivity; an active layer formed on said buffer layer; an ohmic electrode which is formed on an exposed surface portion of said substrate, the exposed surface portion being formed by opening a hole through said buffer layer and said active layer; device electrodes formed on said active layer; and a wiring metal layer which connects said ohmic electrode with said device electrodes.

The second feature of the present invention provides a fabrication method of a compound semiconductor integrated circuit, which is comprised of the following steps: forming a buffer layer having high resistivity on a compound semiconductor substrate; forming an active layer on said buffer layer; executing a mesa-etching for said buffer layer and active layer so that a surface portion of said substrate is exposed and at least one mesa portion comprised of said buffer layer and said active layer is left on said substrate; putting ohmic metals on parts of said exposed portion and mesa portion using an oxide film as a mask so as to form electrodes; and connecting said electrode on said exposed portion with at least one electrode on said mesa portion by a wiring metal layer.

According to said first and second features of this invention, a mesa etching is conducted to the semiconductor wafer having a multi-layer structure so as to remove portions of the upper layers and to expose portions of the substrate surface. An electrode is formed directly on this exposed portion of the substrate. This electrode is then connected with the electrodes formed on the mesa portions, which have been produced as a result of said mesa etching, through a wiring metal layer. On the contrary, in the prior art technique, an electrode, for example, a source electrode, is bonded to a source pad by a wire, and then, this source pad is further connected with a ground electrode formed on the back surface of the substrate. By comparing those techniques, it is apparent that this invention can greatly reduce the number of pads and bonding wires, thus providing a small sized compound semiconductor IC. In addition, a long wire is not required to ground the source electrode, thus reducing the source inductance. Accordingly, a compound semiconductor IC having excellent high-frequency characteristics is obtained. Moreover, when the substrate is composed of multi-layers, in which the middle layer is made of a material having a high dielectric constant (that is, an insulating material), this substrate can operate as a large capacitor by providing electrodes at both sides. So, a compound semiconductor IC, in which a large capacitor is incorporated, is realized in this invention without increasing the chip size and without lowering the production yield.

These and other objectives, features, and advantages of the present invention will be more apparent from the following detailed description of the preferred embodiments in conjunction with the accompanying drawings.

DETAILED DESCRIPTION OF EMBODIMENTS

Figure 1:
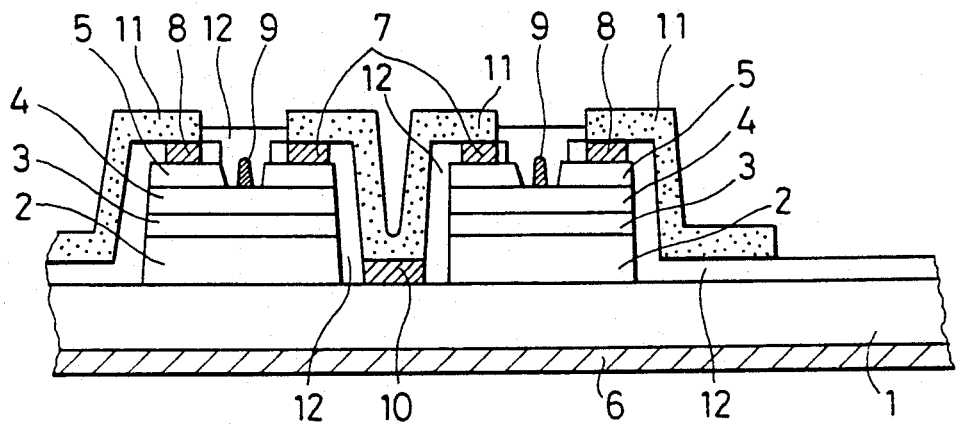
FIG. 1 is a sectional view showing the structure of a compound semiconductor integrated circuit according to the first embodiment of this invention.

FIG. 1 shows the sectional structure of a compound semiconductor IC according to one embodiment of the present invention. In actuality, the circuit shown contains an HEMT (high electron mobility transistor) FET formed on its substrate.

As shown in the figure, this IC is comprised of the following: an n+ type GaAs substrate 1; a buffer layer 2 having a high resistivity; active layers 3, 4, and 5 to form an HEMT FET; a back surface electrode 6; source electrodes 7; drain electrodes 8; gate electrodes 9; a ground electrode 10; and wiring metal layer 11. In this circuit, active layer 3 is made of un-doped GaAs, active layer 4 is made of n type AlGaAs, and active layer 5 is made of n+ type GaAs, thus forming an HEMT structure. In addition, wiring metal layer 11 connects source electrodes 7 with ground electrode 10 as shown in the figure.

The compound semiconductor IC shown in FIG. 1 is fabricated as follows.

(1) At first, buffer layer 2 having a high resistivity is grown on n+ type GaAs substrate 1 about 1 μm thickness. Then un-doped GaAs is grown 0.3 μm thickness on layer 2 to form active layer 3. Next, n+ type $Al_{0.3}Ga_{0.7}As$ is grown 300 Å thickness on layer 3 to form active layer 4, and, n type GaAs is grown 1000 Å thickness on layer 4 to form active layer 5.

(2) Next, the wafer formed as mentioned above undergoes a mesa-etching process. In this process, parts of said layers 2, 3, 4, and 5 are removed so as to form mesas on substrate 1 as well as to expose portions of the surface of substrate 1.

(3) Thereafter, the top surface of said wafer is covered with a CVD film (oxide film) 12, and an ohmic metal is made to adhere to the back surface of substrate 1 so as to form electrode 6. Then, portions of CVD film 12 are removed and source electrodes 7, drain electrodes 8, and ground electrode 10 are formed there, using ohmic metals as electrode materials. Then the wafer undergoes a thermal treatment process.

(4) A recess etching process is conducted next on said wafer, and gate electrodes are formed. Then, the wafer is covered with an insulated film and portions of this film are removed to mark the places in which contacts are to be formed. Wiring metal layer 11 is attached into said places, and thus, source electrodes 7 are connected with the nearby ground electrode 10 through this layer 11.

In this embodiment, as explained above, source electrodes 7 are grounded through ground electrode 10 which is connected to source electrodes 7 by wiring metal layer 11. Therefore, wirings for bonding between the source electrodes and a source pad are not necessary in this embodiment. As a result, the source inductance decreases to result in the improvement of high-frequency characteristics of this circuit. At the same time, the source pad is not required in this embodiment, thus reducing the chip size. So, a small sized compound semiconductor IC having excellent high-frequency characteristics is obtained according to this embodiment.

Figure 2:
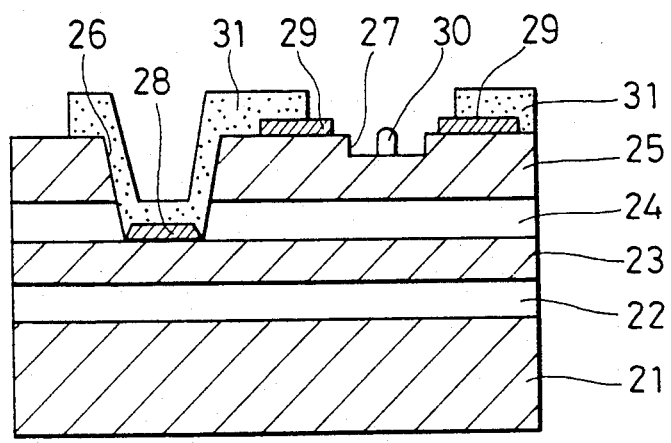
FIG. 2 is a sectional view showing the structure of a compound semiconductor integrated circuit according to the second embodiment of this invention.

FIG. 2 is a sectional view showing the structure of a compound semiconductor IC according to the second embodiment of this invention.

As shown in FIG. 2, the wafer of this circuit is comprised of the following: an n+ type GaAs substrate 21; a un-doped GaAs layer 22 (insulating layer) of 2000 Å thickness; an n+ type GaAs layer 23 of 2000 Å thickness; a un-doped GaAs layer 24 (insulating layer) of 5000 Å thickness; and an n type GaAs layer 25 of 2000 Å thickness, which is to be an active layer. In this wafer, a hole 26 is formed by removing parts of layers 24 and 25 so as to expose a surface portion of layer 23 which will make the upper layer of a condenser. Also, a groove 27 is formed by conducting a recess etching on a surface area of layer 25. On said exposed surface of layer 23, an ohmic electrode 28 is formed by alloying ohmic metals. On layer 25, other ohmic electrodes 29, which become a source and a drain electrodes, are formed at both sides of groove 27. On the other hand, on the bottom surface of groove 27, a gate electrode 30 is formed. The surface of hole 26 including ohmic electrode 28 is covered with a wiring metal layer 31. This layer 31 also covers at least a portion of ohmic electrodes 29 so as to connect ohmic electrode 28 with electrodes 29. In this circuit device, GaAs layers 21, 22, and 23 make a three dimensional condenser.

Figure 3:
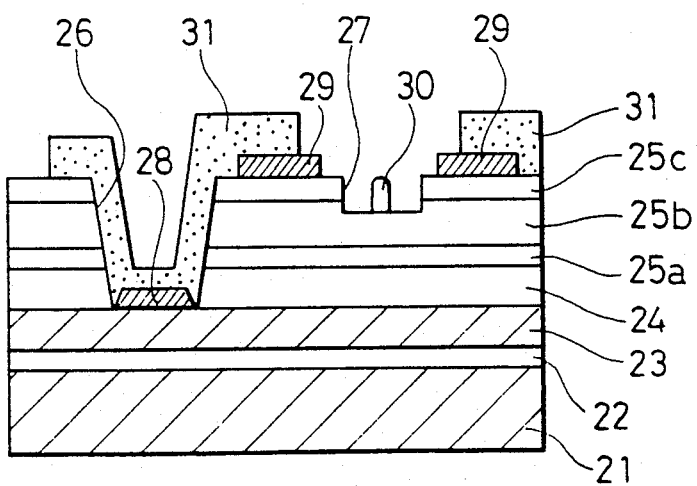
FIG. 3 is a sectional view showing the structure of a compound semiconductor integrated circuit according to the third embodiment of this invention.

FIG. 3 is a sectional view showing the structure of a compound semiconductor IC according to the third embodiment of this invention. In FIGS. 2 and 3, the same or the similar structure members are shown using the same numbers.

The circuit device shown in FIG. 3 is characterized by the fact that a un-doped GaAs layer 25a, an n type AlGaAs layer 25b, and an n+ type GaAs layer 25c make an active layer which corresponds to active layer 25 shown in FIG. 2. This three layer structure is called an HEMT structure in which the operation speed is greatly improved. In this circuit device, n+ type GaAs substrate 21, un-doped GaAs layer 22, and n+ type GaAs layer 23 make a three dimensional condenser.

Figure 4:
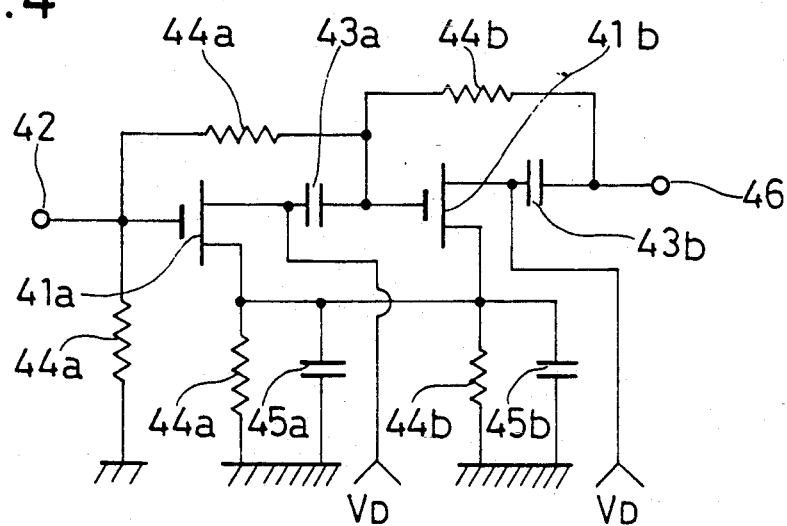
FIG. 4 is a diagram showing the equivalent circuit of the compound semiconductor integrated circuit shown in FIGS. 2 and 3.
Figure 5:
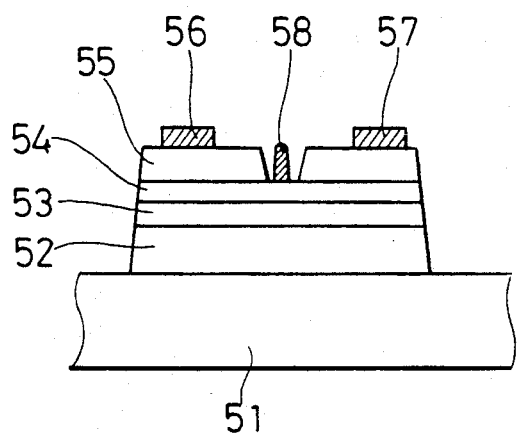
FIG. 5 is a sectional view showing the structure of a compound semiconductor integrated circuit according to one prior art of this invention.
Figure 6:
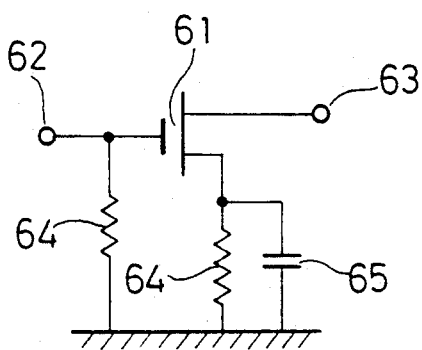
FIG. 6 is a diagram showing the equivalent circuit of the compound semiconductor integrated circuit shown in FIG. 5.

FIG. 4 is the equivalent circuit diagram of the device shown in FIGS. 2 and 3. As shown in FIG. 4, the gate electrode of GaAs FET 41a is connected to input terminal 42, and the drain electrode is connected to condenser 43a. At the source electrode of FET 41a, resistor 44a, 44b and condenser 45a, 45b are connected. The other ends of resistor 44a, 44b and condenser 45a, 45b are both grounded. Input terminal 42 is also grounded through resistor 44a. The resistor 44a is inserted between input terminal 42 and condenser 43a. The drain electrode of GaAs FET 41a is connected with the gate electrode of GaAs FET 41b through condenser 43a. The drain electrode of GaAs FET 41b is connected to output terminal 46 through condenser 43b. In addition, at the source electrode of GaAs FET 41b, resistor 45a, 44b and condenser 45a, 45b are connected in the same manner as the connection among FET 41a, resistor 44a, 44b and condenser 45a, 45b. Between condenser 43a and output terminal 46, resistor 44b is inserted.

When the circuit device shown in FIG. 3 is used instead of the device shown in FIG. 2, GaAs FETs 41a and 41b will be replaced with AlGaAs FETs having the HEMT structure. The rest of circuit members are the same as those of shown in FIG. 4.

As explained above, a three dimensional condenser, which is composed of n+ type GaAs substrate 21, un-doped GaAs layer 22, and n+ type GaAs layer 23, is formed beneath the active layer in this embodiment. Therefore, a condenser having a large capacity can be obtained without increasing the chip size. In addition, the upper layer of this condenser is connected to the source electrodes of two FETs. As a result, the condenser is held in common by the two FETs, thus reducing the chip size by 20% without lowering the yield of devices. Moreover, the FETs can be grounded within the shortest distance through the condenser, thus improving the high-frequency characteristics.

In summary, according to the present invention, a small sized compound semiconductor IC having excellent high-frequency characteristics is obtained without lowering the production yield. In addition, a large capacitor can be incorporated into this IC without lowering the production yield and without increasing the chip size.

What is claimed is:

1. A compound semiconductor integrated circuit, comprising:
   a compound semiconductor substrate;
   a buffer layer having a high resistivity which is formed on said substrate;
   an active layer formed on said buffer layer;
   an ohmic electrode which is formed on an exposed surface portion of said substrate, the exposed surface portion being formed by opening a hole through said buffer layer and said active layer;
   device electrodes formed on said active layer; and
   a wiring metal layer which connects said ohmic electrode with at least one of said device electrodes, wherein said substrate is made of n+ type GaAs, said buffer layer is made of un-doped GaAs, and said active layer is made of n type GaAs.

2. A compound semiconductor integrated circuit, comprising:
   a compound semiconductor substrate;
   a buffer layer having a high resistivity formed on said substrate;
   an active layer formed on said buffer layer;
   an ohmic electrode which is formed on an exposed surface portion of said substrate, the exposed surface portion being formed by opening a hole through said buffer layer and said active layer;
   device electrodes formed on said active layer; and
   a wiring metal layer which connects said ohmic electrode with at least one of said device electrodes, wherein said substrate is comprised of a first n+ type GaAs layer, an un-doped GaAs layer, a second n+ type GaAs layer so as to form a large capacitor.

3. The compound semiconductor integrated circuit as claimed in claim 2, wherein at least two mesa portions are formed on said substrate so as to form at least two FETs.

4. The compound semiconductor integrated circuit as claimed in claim 2, wherein said active layer has a multilayer structure in which an un-doped GaAs layer, an n type AlGaAs layer, and an n+ type GaAs layer are included.

* * * * *